United States Patent [19]
Stonick et al.

[11] Patent Number: 5,900,778
[45] Date of Patent: May 4, 1999

[54] ADAPTIVE PARAMETRIC SIGNAL PREDISTORTER FOR COMPENSATION OF TIME VARYING LINEAR AND NONLINEAR AMPLIFIER DISTORTION

[76] Inventors: John T. Stonick, 5738 Wilkins Ave., Pittsburgh, Pa. 15217; Virginia L. Stonick, 2306 NW. Hummingbird, Corvallis, Oreg. 97330; José M. F. Moura, 6645 Woodwell St., Pittsburgh, Pa. 15217

[21] Appl. No.: 08/852,944

[22] Filed: May 8, 1997

[51] Int. Cl.$^6$ .................................................... H03F 1/26
[52] U.S. Cl. ........................ 330/149; 332/103; 332/162
[58] Field of Search ................................. 330/149, 107; 332/159, 160, 161, 162; 455/126; 375/296, 297

[56] References Cited

U.S. PATENT DOCUMENTS

| | | | |
|---|---|---|---|
| 4,291,277 | 9/1981 | Davis et al. | 330/149 |
| 4,412,337 | 10/1983 | Bickley et al. | 375/60 |
| 4,462,001 | 7/1984 | Girard | 330/149 |
| 4,554,514 | 11/1985 | Whartenby et al. | 330/149 |
| 4,700,151 | 10/1987 | Nagata | 332/18 |
| 4,967,164 | 10/1990 | Sari | 330/149 |
| 5,049,832 | 9/1991 | Cavers | 330/149 |
| 5,107,520 | 4/1992 | Karam et al. | 375/60 |
| 5,113,414 | 5/1992 | Karam et al. | 330/149 |
| 5,148,448 | 9/1992 | Karam et al. | 375/60 |
| 5,699,383 | 12/1997 | Ichiyoshi | 455/126 |

FOREIGN PATENT DOCUMENTS 1246209  9/1971  United Kingdom .

Primary Examiner—Robert Pascal
Assistant Examiner—Khanh Van Nguyen
Attorney, Agent, or Firm—Webb Ziesenheim Bruening Logsdon Orkin & Hanson, P.C.

[57] ABSTRACT

A high power amplifier system includes an on-line adaptive predistorter for generating predistorted complex data signals to a high power amplifier in response to receiving incoming complex data signals from a remote source. The predistorted complex data signals enable the high powered amplifier to output signals corresponding to the incoming complex data signals. The amplifier system includes an off-line adaptive predistorter which has an adaptive parametric forward filter for combining predistorted complex data signals and demodulated complex data signals, produced from the output of the high power amplifier, to produce an optimized forward amplitude filter that emulates the forward amplitude response of the amplifier, and an optimized inverse phase filter that emulates the inverse phase response of the amplifier. An adaptive parametric inverse filter combines random amplitude data and the optimized forward amplitude filter of the amplifier to produce an optimized inverse amplitude filter that emulates the inverse amplitude response of the amplifier. An off-line to on-line converter combines the optimized inverse amplitude filter, the optimized inverse phase filter and exemplary complex data to produce the predistorted complex data utilized by the on-line adaptive predistorter for generating the predistorted complex data signals.

17 Claims, 6 Drawing Sheets

ADAPTIVE PARAMETRIC SIGNAL PREDISTORTER FOR COMPENSATION OF TIME VARYING LINEAR AND NONLINEAR AMPLIFIER DISTORTION

BACKGROUND OF THE INVENTION

1. Field of the Invention

The present invention relates to adaptive predistorters for compensating time varying nonlinear amplitude and phase distortion of high power amplifiers used for transmission of data in digital communication systems.

2. Description of the Prior Art

Digital transmission application, such as wireless and wireline video, multimedia, audio and data transmission, have created the need for high data throughput in bandlimited channels. To obtain the required throughput, multi-amplitude and multi-phase modulation schemes such as Quadrature Amplitude Modulation (QAM), Vestigial Sideband Modulation (VSB), and Coded Orthogonal Frequency Division Multiplexing (COFDM) are being utilized. These modulation schemes increase the order of modulation thereby providing the required throughput. However, increasing the order of the modulation also increases the sensitivity of these modulation schemes to distortion. Typical sources of distortion include, for example, High Power Amplifier (HPA) nonlinearity, multipath distortion, additive noise, and analog circuit imperfection. Moreover, digital transmission applications, such as, digital television, are subject to stringent out-of-band emission requirements. The sensitivity to distortion and the stringent out-of-band restrictions require that the output of HPAs not be contaminated with nonlinear amplification products.

In HPAs, these nonlinear amplification products include nonlinear amplitude-dependent phase distortion (AM/PM) and nonlinear amplitude-dependent amplitude distortion (AM/AM). The AM/PM and AM/AM distortions are produced by the transistors of the HPA operating in nonlinear regions of their operation. For example, very large input signals may cause the transistors to saturate and very small input signals may have insufficient amplitude to cause the transistors to conduct.

One approach to eliminate this distortion includes limiting the amplitude of the input signal so that the HPA operates within its linear operating range. This approach, however, fails to utilize the full amplification capability of the HPA. Another approach is to predistort the input signal so that the HPA produces a desired, undistorted output.

Signal predistortion typically includes pre-amplifying and pre-phase shifting the input of the HPA to compensate for the saturation and phase shift thereof. One method of predistortion includes mapping predistorted data, comprised of an in-phase portion and a quadrature portion of a complex data signal, into a lookup table. In response to the input of a complex signal from a remote source, predistorted data are selectively retrieved from the lookup table, modulated and passed through the HPA. If the predistorted data are properly selected, the demodulated output of the HPA will be a linearly amplified version of the input complex signal from the remote source. However, the manner in which the inverse of the HPA nonlinearity is estimated and implemented affects the creation of the lookup table.

One problem with prior art predistortion methods is that input signals undergoing the most severe distortion are the signals having the largest or smallest amplitude. Moreover, signals having the largest or smallest amplitudes are also signal levels which are least likely to occur. Hence, prior art predistortion methods which utilize the output of the HPA to determine the best inverse to the output of the HPA have the least data where it is most needed. Another problem with prior art predistortion methods is that they do not take advantage of the correlation between distortion experienced by signals of similar power levels. Specifically, distortion created for one input signal amplitude is highly correlated with distortion created for a similar, but distinct, input signal amplitude. The lookup table values of prior art predistorters are continuously updated as a function of input signals being amplified immediately preceding update of the lookup tables. Hence, different input signals having similar input signal amplitudes may produce different lookup table values. These different lookup table values are caused by measurement distortion of the signal output by the HPA. Typical sources of measurement distortion include thermal noise, frequency response and group delay response of analog filters in the modulation and demodulation conversion process, phase noise of local oscillators utilized in the modulator and demodulator, and timing errors in the conversion of analog signals to digital signals.

Another problem with prior art predistortion methods is the absence of determining the gradient of the AM/AM distortion of the HPA. Not including the gradient of the AM/AM distortion of the HPA in the determination of the optimal inverse AM/AM HPA predistorted data increases the error in the AM/AM inverse estimate.

SUMMARY OF THE INVENTION

It is an object of the present invention to overcome the above-discussed and other problems of the prior art by providing an amplifier system which includes an off-line adaptive predistorter which generates predistortion data utilized to produce at an output of the amplifier system an analog signal that corresponds to an input complex data signal to the amplifier system from a remote source.

It is an object of the present invention to provide a method and apparatus for creating predistorted data symbol values that are utilized to linearlize the amplification of high power amplifiers.

Accordingly, we have invented an amplifier system that includes an on-line adaptive predistorter for receiving an incoming complex signal. The on-line adaptive predistorter generates a predistorted complex signal related to the incoming complex signal. A modulator receives the predistorted complex signal and produces therefrom a modulated analog signal. An amplifier receives a modulated analog signal and produces an amplified modulated analog signal. A demodulator demodulates at least a sample of the amplified modulated analog signal and produces therefrom a demodulated complex signal. An adaptive forward filter combines the predistorted complex signal and the demodulated complex signal to produce an optimized forward amplitude filter that emulates the forward amplitude response of the amplifier and an optimized inverse phase filter that emulates the inverse phase response of the amplifier. An adaptive inverse filter filters the output of the optimized forward amplitude filter to produce an optimized inverse amplitude filter that emulates the inverse amplitude response of the amplifier. An off-line to on-line converter combines the response of the optimized inverse amplitude filter and the response of the optimized inverse phase filter to produce predistorted complex data that is utilized for generating the predistorted complex signal.

The adaptive inverse filter can combine random amplitude data and the optimized forward amplitude filter to produce the output which is utilized to produce the optimized inverse amplitude filter. For each input of random amplitude data, the adaptive inverse filter produces a forward amplitude error value which is combined with the random amplitude data to produce an amplitude error value. The random amplitude data is selected to cause the adaptive inverse filter to adapt to minimize to a desired extent the amplitude error value. The adaptive inverse filter includes an inverse amplitude filter for filtering the random amplitude data to produce filtered random amplitude data and a summing circuit for summing the random amplitude data and the forward amplitude error value to produce the amplitude error value. The optimized forward amplitude filter is utilized to filter the filtered random amplitude data to produce the forward amplitude error value. A curve fitting algorithm is utilized to update the parameters of the inverse amplitude filter to minimize to a desired extent the amplitude error value. The inverse amplitude filter with updated parameters forms the optimized inverse amplitude filter.

The off-line to on-line converter can utilize exemplary complex data to stimulate the response of the optimized inverse amplitude filter and the response of the optimized inverse phase filter to produce the predistorted complex data. This off-line to on-line converter includes a rectangular-to-polar converter which converts the exemplary complex data to exemplary polar data. The amplitude portion of the exemplary polar data is filtered by the optimized inverse amplitude filter to produce an amplitude portion of polar predistorted data. The amplitude portion of the polar predistorted data is filtered by the optimized inverse phase filter to produce inverse phase data. A summing circuit combines the phase portion of the exemplary polar data and the inverse phase data to produce a phase portion of polar predistorted data. A polar-to-rectangular converter converts the amplitude portion of polar predistorted data and the phase portion of polar predistorted data into the predistorted complex data.

The adaptive forward filter can include a rectangular-to-polar converter for converting the predistorted complex signal into a predistorted polar signal and for converting the demodulated complex signal into a demodulated polar signal. A forward amplitude filter filters the amplitude portion of the predistorted polar signal and produces a filtered amplitude portion of the predistorted polar signal. A summing circuit combines the filtered amplitude portion of the predistorted polar signal and the amplitude portion of the demodulated polar signal to produce a polar amplitude difference value. A curve fitting algorithm is utilized to update the parameters of the forward amplitude filter to minimize to a desired extent the polar amplitude difference value. The forward amplitude filter with updated parameters forms the optimized forward amplitude filter.

An inverse phase filter can be utilized to filter the amplitude portion of the predistorted polar signal into a filtered phase value. A first summing circuit combines the phase portion of the predistorted polar signal and the phase portion of the demodulated polar signal to produce a polar phase difference value. A second summing circuit combines the polar phase difference value and the filtered phase value to obtain a phase error value. A curve fitting algorithm is utilized to update the parameters of the inverse phase filter to minimize to a desired extent the phase error value. The negative of the inverse phase filter with updated parameters forms the optimized inverse phase filter.

We have also invented a method of determining predistorting data which are utilized to compensate for non-linear amplitude and phase distortions of an amplifier in which incoming complex signals are converted to corresponding predistorted complex signals. The predistorted complex signals are modulated to produce modulated analog signals which are amplified to produce amplified analog signals. The amplified analog signals are demodulated to produce demodulated complex signals. Each predistorted complex signal and a temporally corresponding demodulated complex signal are sampled and combined to produce predistorted data utilized to generate the predistorted complex signals.

DETAILED DESCRIPTION OF THE PREFERRED EMBODIMENTS

Figure 1:
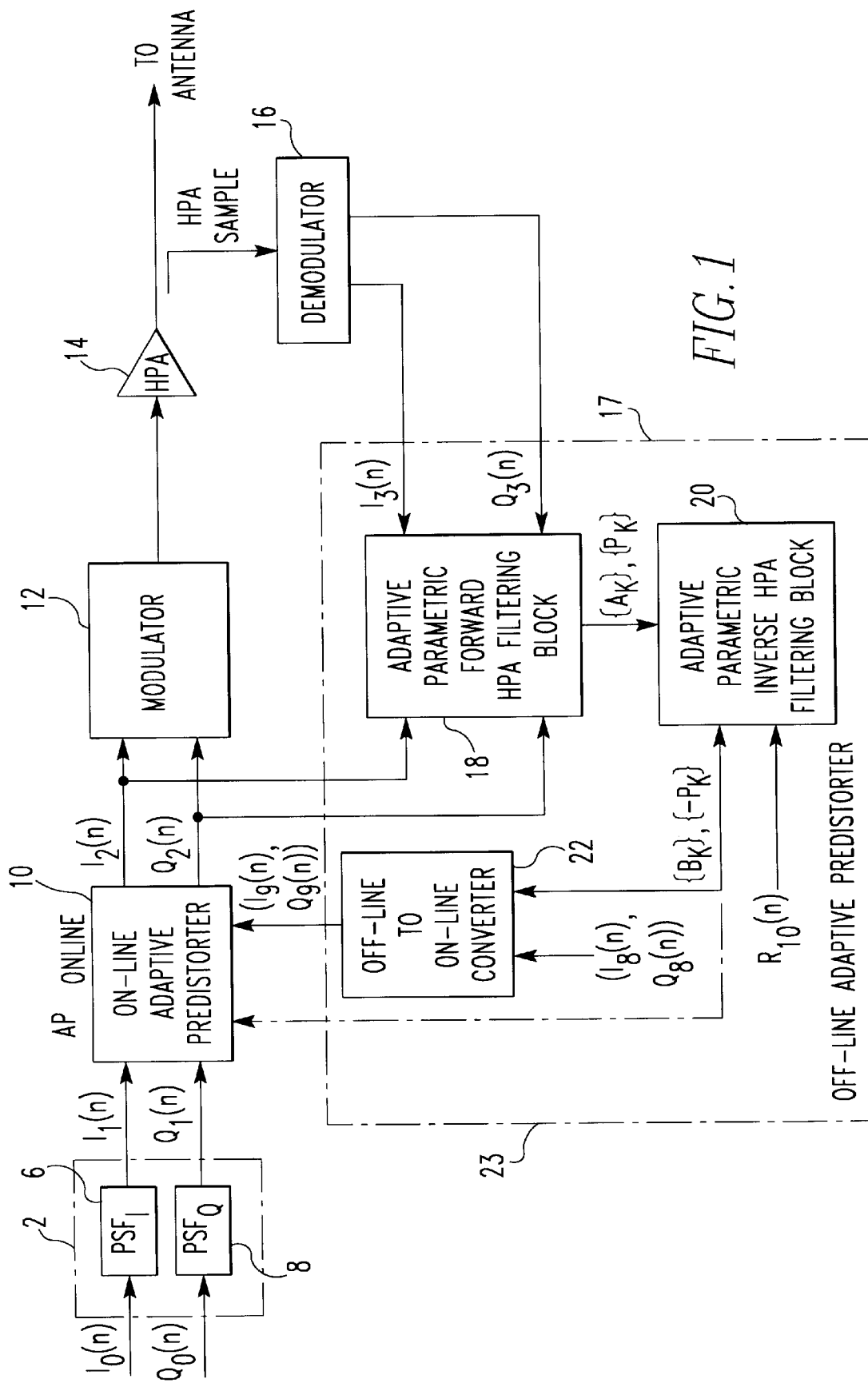
FIG. 1 is a generalized block diagram of an amplifier system in accordance with the present invention.

With reference to FIG. 1, an amplifier system includes a pulse-shaping filter 2 for receiving an incoming complex signal ($I_0(n)$, $Q_0(n)$) from a remote source (not shown). The incoming complex signal ($I_0(n)$, $Q_0(n)$) includes in-phase portion $I_0(n)$ and quadrature portion $Q_0(n)$. The pulse-shaping filter 2 includes a filter 6 and a filter 8 for filtering the in-phase portion $I_0(n)$ and the quadrature portion $Q_0(n)$ of the incoming complex signal, respectively. The pulse-shaping filter 2 provides a filtered complex signal ($I_1(n)$, $Q_1(n)$) to an on-line adaptive predistorter 10.

In response to receiving the filtered complex signal ($I_1(n)$, $Q_1(n)$) from the pulse-shaping filter 2, the on-line adaptive predistorter 10 generates a predistorted complex signal ($I_2(n)$, $Q_2(n)$) that includes predistorted in-phase portion $I_2(n)$ and predistorted quadrature portion $Q_2(n)$. The predistorted complex signal ($I_2(n)$, $Q_2(n)$) output by the on-line adaptive predistorter 10 is provided to a modulator 12. The modulator 12 modulates the predistorted complex signal ($I_2(n)$, $Q_2(n)$) and delivers a modulated analog signal to a high power amplifier (HPA) 14. The HPA 14 amplifies the modulated analog signal and provides to an antenna (not shown) an amplified analog signal. A sample of the amplified analog signal is provided to a demodulator 16. The demodulator 16 demodulates the sample analog signal into a demodulated complex signal ($I_3(n)$, $Q_3(n)$) that includes demodulated in-phase portion $I_3(n)$ and demodulated quadrature portion $Q_3(n)$.

An off-line adaptive predistorted 17 receives the predistorted complex signal ($I_2(n)$, $Q_2(n)$) and the demodulated complex signal ($I_3(n)$, $Q_3(n)$) and generates therefrom predistorted complex data ($I_9(n)$, $Q_9(n)$). More specifically, the off-line adaptive predistorter 17 includes an adaptive parametric forward HPA filtering block 18 which combines the predistorted complex signal ($I_2(n)$, $Q_2(n)$) and the demodulated complex signal ($I_3(n)$, $Q_3(n)$) to produce an optimized forward amplitude filter $\{A_k\}$ which emulates the forward amplitude response of the HPA 14 and an optimized forward phase filter {$P_k$} which emulates the forward phase response of the HPA 14. The optimized forward amplitude filter {$A_k$} and the optimized forward phase filter {$P_k$} are provided to an adaptive parametric inverse HPA filtering block 20. The adaptive parametric inverse HPA filtering block 20 combines the optimized forward amplitude filter {$A_k$} with random amplitude data $R_{10}(n)$, provided in a manner to be described in greater detail hereinafter, to produce an optimized inverse amplitude filter {$B_k$}. The random amplitude data $R_{10}(n)$ are selected based on an apriori analysis of the amplitude and phase characteristics of the HPA 14 in response to input signals having amplitudes varying between small signal amplitudes and large signal amplitudes for the designed input of the HPA 14. The adaptive parametric inverse HPA filtering block 20 provides the optimized inverse amplitude filter {$B_k$} and the negative of the optimized forward phase filter {$P_k$}, hereinafter the optimized inverse phase filter {$-P_k$}, to an off-line to on-line converter 22. In another embodiment, the adaptive parametric forward HPA filtering block 18 generates the optimized inverse phase filter {$-P_k$} and provides the same directly to the off-line to on-line converter 22.

The off-line to on-line converter 22 combines exemplary complex data ($I_8(n)$, $Q_8(n)$), provided in a manner to be described in greater detail hereinafter, with the optimized inverse amplitude filter {$B_k$} and the optimized inverse phase filter {$-P_k$} to generate the predistorted complex data ($I_9(n)$, $Q_9(n)$). The exemplary complex data ($I_8(n)$, $Q_8(n)$) are data corresponding to one or more possible filtered complex signals ($I_1(n)$, $Q_1(n)$) provided to the on-line adaptive predistorter 10.

At a suitable time the predistorted complex data ($I_9(n)$, $Q_9(n)$) are provided to the on-line adaptive predistorter 10 where it is stored in a memory thereof for use in generating the predistorted complex signal ($I_2(n)$, $Q_2(n)$). Storing the predistorted complex data ($I_9(n)$, $Q_9(n)$) enables the on-line adaptive predistorter 10 to generate the predistorted complex signal ($I_2(n)$, $Q_2(n)$) by fetching from the memory the predistorted complex data ($I_9(n)$, $Q_9(n)$).

In another embodiment, the adaptive parametric inverse HPA filtering block 20 provides the optimized inverse amplitude filter {$B_k$} and the optimized inverse phase filter {$-P_k$} to the on-line adaptive predistorter 10, as shown by dashed line 23 in FIG. 1. In this embodiment, each predistorted complex signal ($I_2(n)$, $Q_2(n)$) is determined in real time in response to the on-line adaptive predistorter 10 receiving a filtered complex signal ($I_1(n)$, $Q_1(n)$).

Figure 2:
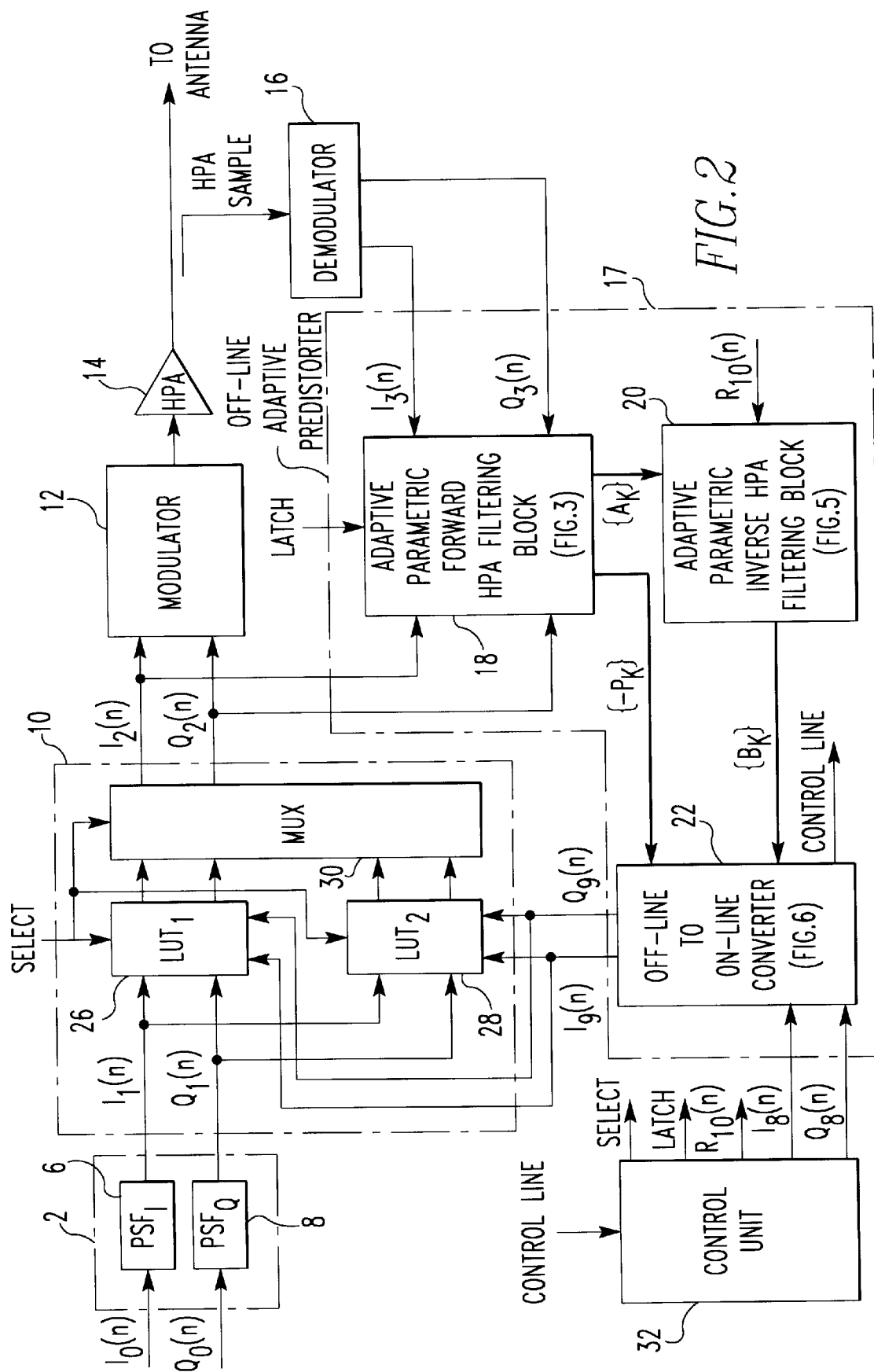
FIG. 2 is a block diagram of a preferred embodiment of an amplifier system in accordance with the present invention.

With reference to FIG. 2, the on-line adaptive predistorter 10 preferably includes a first lookup table ($LUT_1$) 26, a second lookup table ($LUT_2$) 28 and a multiplexer 30. The filtered complex signal ($I_1(n)$, $Q_1(n)$) is provided in parallel to the lookup tables 26, 28. The output of the lookup tables 26, 28, i.e., predistorted complex signal ($I_2(n)$, $Q_2(n)$), is provided to the multiplexer 30. A control unit 32 provides a select signal to the lookup tables 26, 28 and the multiplexer 30 to select which of the lookup tables 26, 28 is used to provide the predistorted complex signal ($I_2(n)$, $Q_2(n)$) to the modulator 12. Each lookup table 26, 28 may have different predistorted complex data ($I_9(n)$, $Q_9$ (n)) stored therein depending on, without limitation, changes in amplitude-dependent phase distortion (AM/PM) and the amplitude-dependent amplitude distortion (AM/AM) of the HPA 14 during operation.

Figure 3:
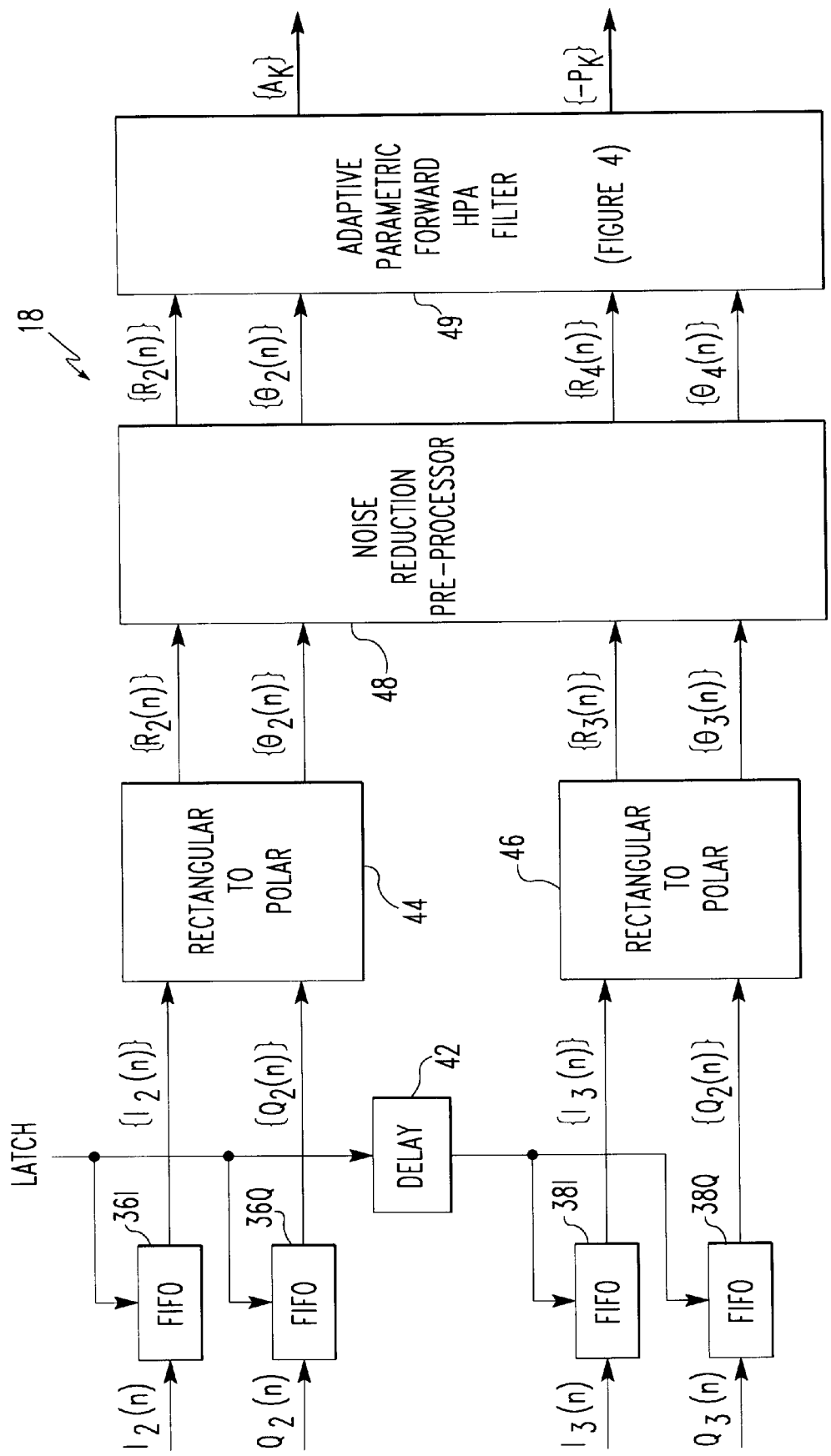
FIG. 3 is a block diagram of the adaptive parametric forward HPA filtering block of FIG. 2.

With reference to FIG. 3 and with ongoing reference to FIG. 2, the off-line adaptive predistorter 17 includes the adaptive parametric forward HPA filtering block 18. The parametric forward HPA filtering block 18 includes a pair of first-in first-out (FIFO) registers 36I, 36Q for sampling periodically the respective predistorted in-phase portion $I_2(n)$ and quadrature portion $Q_2(n)$ of the predistorted complex signal ($I_2(n)$, $Q_2(n)$). Another pair of FIFO registers 38I, 38Q is connected to receive the in-phase portion $I_3(n)$ and quadrature portion $Q_3(n)$ of the demodulated complex signal ($I_3(n)$, $Q_3(n)$). Preferably, the same temporal portions of the demodulated complex signal ($I_3(n)$, $Q_3(n)$) and the predistorted complex signal ($I_2(n)$, $Q_2(n)$) are sampled by FIFO registers 36I, 36Q and FIFO registers 38I, 38Q, respectively. Because the predistorted complex signal ($I_2(n)$, $Q_2(n)$) passes through modulator 12, HPA 14 and demodulator 16, it is necessary to delay the sampling of demodulated complex signal ($I_3(n)$, $Q_3(n)$) by FIFO registers 38I, 38Q by an interval corresponding to signal propagation delay through modulator 12, HPA 14 and demodulator 16. To cause data to be latched into FIFO registers 36I, 36Q, 38I and 38Q, a latch signal is provided at an appropriate time from a control unit 32. The latch signal is provided directly to FIFO registers 36I, 36Q and is provided to FIFO registers 38I, 38Q through delay generator 42 which preferably introduces a delay corresponding to the signal propagation delay through modulator 12, HPA 14 and demodulator 16.

When a desired quantity of complex data samples have been sampled, the FIFO registers 36I, 36Q provide their predistorted complex data sets ({$I_2(n)$}, {$Q_2(n)$}) to a first rectangular-to-polar converter 44, and the FIFO registers 38I, 38Q provide their demodulated complex data sets ({$I_3(n)$}, {$Q_3(n)$}) to a second rectangular-to-polar converter 46. The rectangular-to-polar converters 44, 46 convert the complex data sets provided thereto into predistorted amplitude and phase data sets ({$R_2(n)$}, {$\theta_2(n)$}) and demodulated amplitude and phase data sets ({$R_3(n)$} {$\theta_3(n)$}), respectively. The predistorted amplitude and phase data sets ({$R_2(n)$}, {$\theta_2(n)$}) and the demodulated amplitude and phase data sets ({$R_3(n)$} {$\theta_3(n)$}) are provided to a noise reduction preprocessor 48.

To enable efficient filtration of measurement noise, the noise reduction preprocessor 48 orders in ascending amplitude order the predistorted amplitude data set {$R_2(n)$}. The demodulated amplitude data set {$R_3(n)$} and the demodulated phase data set {$\theta_3(n)$} are ordered by the sorted index of the predistorted amplitude data set {$R_2(n)$} and filtered by a digital filter of the noise reduction pre-processor 48 to smooth out measurement noise and produce filtered amplitude and phase data sets ({$R_4(n)$}, {$Q_4(n)$}). Once filtered, each data set is returned or reordered to its original order and provided to an adaptive parametric forward HPA filter 49.

Figure 4:
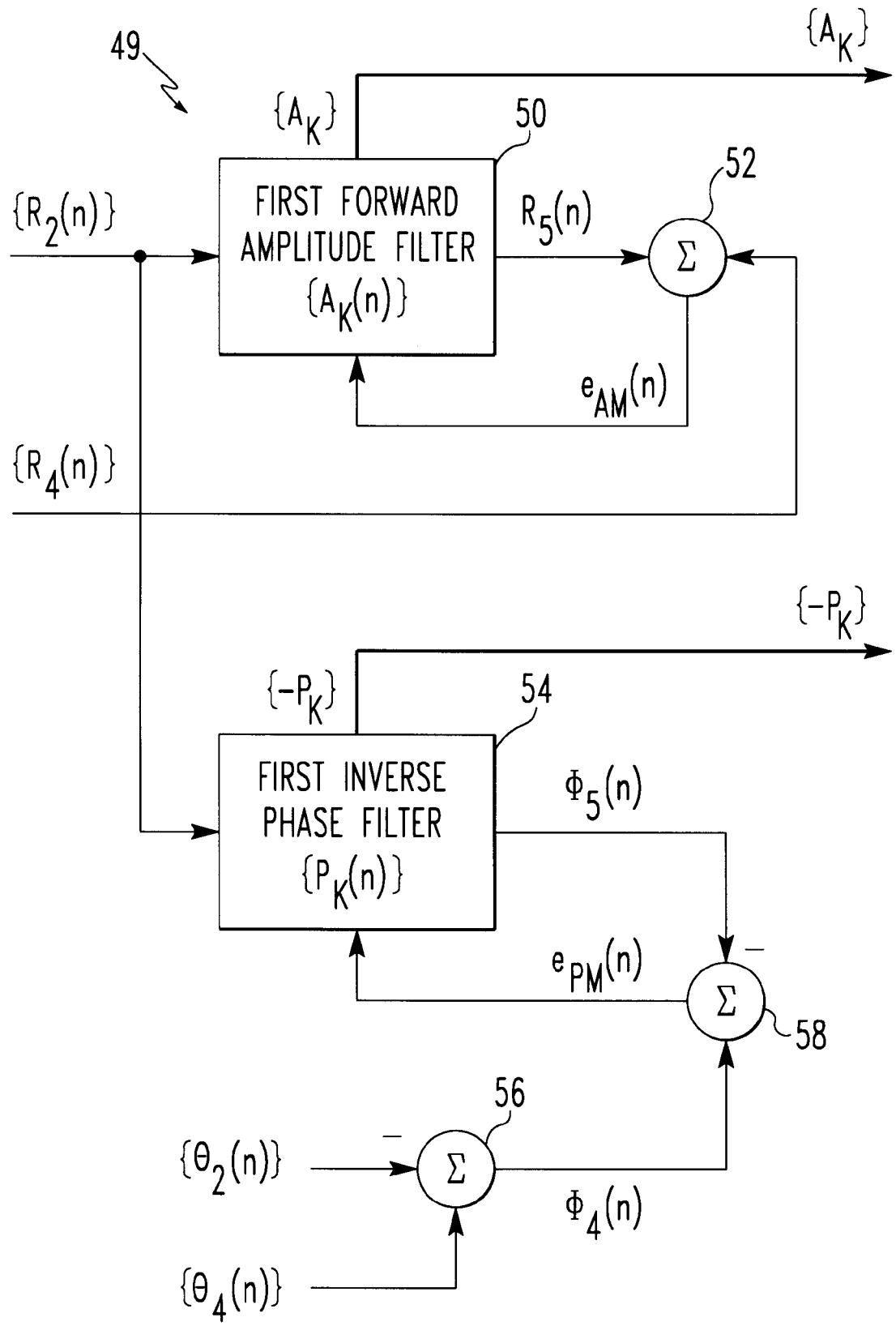
FIG. 4 is a block diagram of the adaptive parametric forward HPA filter of FIG. 3.

With reference to FIG. 4, and with continuing reference to FIGS. 2 and 3, the adaptive parametric forward HPA filter 49 includes a first forward amplitude filter 50 for receiving data from the predistorted amplitude data set {$R_2(n)$}. The first forward amplitude filter 50 implements the polynomial filter:

$$R_5(n) = \sum_{i=0}^{N_{AM}} A_i(n) R_2^i(n) \tag{EQ1}$$

For each data sample $R_2(n)$ of the predistorted amplitude data set {$R_2(n)$} received, the forward amplitude filter 50 generates a filtered amplitude value $R_5(n)$. Each data sample of $R_4(n)$ of the filtered amplitude data set {$R_4(n)$} and corresponding filtered amplitude value $R_5(n)$ are provided to a summing circuit 52 where they are subtractively combined to produce a polar amplitude difference value $e_{AM}(n)$. The polar amplitude difference value $e_{AM}(n)$ is provided in a feedback mode to the first forward amplitude filter 50.

The amplitude parameters $A_i(n)$ in EQ1, above, are updated to minimize to a desired extent the polar amplitude difference value $e_{AM}(n)$ preferably utilizing a least mean squares curve fitting algorithm, preferably implemented in the forward amplitude filter 50. Specifically, the amplitude parameters $A_i(n)$ are updated according to the following equation:

$$A_k(n+1) = A_k(n) + \mu_k(n) R_2^i(n) e_{AM}(n), k=0, 1, \ldots, N_{AM} \quad \text{(EQ2)}$$

where $\mu_k$ is the time-varying step size which is chosen to guarantee fast and stable initial convergence of the amplitude parameters $A_i(n)$ in EQ1 and a small final polar amplitude difference value $e_{AM}(n)$, $N_{AM}$ is the order of the forward amplitude filter 50 which is chosen based upon apriori measurements of the AM/AM distortion and the initial values of the amplitude parameters $A_i(n)$ in EQ1 are chosen based upon apriori measurements of the AM/AM distortion. The least means squares curve fitting algorithm is preferred, however, other curve fitting algorithms, such as median, least squares, weighted least squares, min-max, and recursive least squares may also be utilized.

The curve fitting algorithm is preferably chosen to minimize the bit error rate in a receiver (not shown) and thus may be different for different types of HPAs. Preferably, the same data set values of the predistorted amplitude data set $\{R_2(n)\}$ and the filtered amplitude data set $\{R_4(n)\}$ are utilized multiple times to update the amplitude parameters $A_k(n)$ until the amplitude parameters $A_k(n)$, of EQ2 above, converge to a steady state. The converged values of the amplitude parameters $A_k(n)$ are saved and used as initial values of $A_i(n)$ in EQ1 for the subsequent set of HPA I/O data, i.e., the next collect set of $\{R_2(n)\}$ and $\{R_4(n)\}$.

The first forward amplitude filter 50 with amplitude parameters $A_i(n)$ converged to a steady state form an optimized forward amplitude filter $\{A_k(n)\}$ that emulates the forward amplitude response of the HPA 14.

The amplitude data set $\{R_2(n)\}$ is also provided to a first inverse phase filter 54. The first inverse phase filter 54 implements the polynomial filter:

$$\phi_5(n) = \sum_{i=0}^{N_{AM}} P_i(n) R_2^i(n) \quad \text{(EQ3)}$$

where $\phi_5(n)$ is a filtered phase value. Each data sample of the predistorted phase data set $\{\theta_2(n)\}$ and each data sample of the demodulated phase data set $\{\theta_4(n)\}$ are subtractively combined by a summing circuit 56 which produces a polar phase difference value $\{\theta_4(n)\}$. A summing circuit 58 subtractively combines the filtered phase value $\phi_5(n)$ and the polar phase difference value $\phi_4(n)$ to produce a polar phase error value $e_{PM}(n)$. The phase parameters $P_i(n)$ are updated to minimize to a desired extent the polar phase error value $e_{PM}(n)$. A least means squares algorithm, preferably implemented in the first inverse phase filter 54, is utilized to update the phase parameters $P_i(n)$. Specifically, the phase parameters $P_i(n)$ are updated according to the following equation:

$$P_k(n+1) = P_k(n) + v_k(n) R_2^i(n) e_{PM}(n), k=0, 1, \ldots, N_{PM} \quad \text{(EQ4)}$$

where $v_k$ is a time-varying step size chosen to guarantee fast and stable initial convergence of the phase parameters $P_i(n)$ in EQ3 and a small final phase error value $e_{PM}(n)$, $N_{PM}$ is the order of the first inverse phase filter 54 chosen based upon apriori measurements of the AM/PM distortion and the initial values of $P_i(n)$ are chosen based upon apriori measurements of the AM/PM distortion. Preferably, the predistorted amplitude data set $\{R_2(n)\}$, the predistorted phase data set $\{\theta_2(n)\}$ and the filtered phase data set $\{\theta_4(n)\}$ are utilized multiple times to update the phase parameters of $P_k(n)$ until the phase parameters $P_k(n)$, of EQ4 above, converge to a steady state. Preferably, the converged values of the phase parameters $P_k(n)$ are saved and utilized as the initial values for $P_i(n)$ in EQ3 for the subsequent set of HPA I/O data.

Measurement noise creates a larger phase measurement error when the input amplitude is small. Accordingly, to avoid the introduction of phase measurement error due to measurement noise, the phase parameters $P_k(n)$ of EQ4 above are not updated when a data sample of the predistorted amplitude data set $\{R_2(n)\}$ is below a predetermined threshold.

Because the AM/PM distortion is additive and amplitude-dependent, the negative of the converged phase parameters $P_k(n)$ are the optimal parameters of the first inverse phase filter 54. Preferably, the first inverse phase filter 54 converts the phase parameters $P_k(n)$ to negative phase parameters $-P_k(n)$. The first inverse phase filter 54 with negative phase parameters $-P_k(n)$ converged to a steady state form an optimized inverse phase filter $\{-P_k(n)\}$ that emulates the inverse phase response of the HPA 14.

Figure 5:
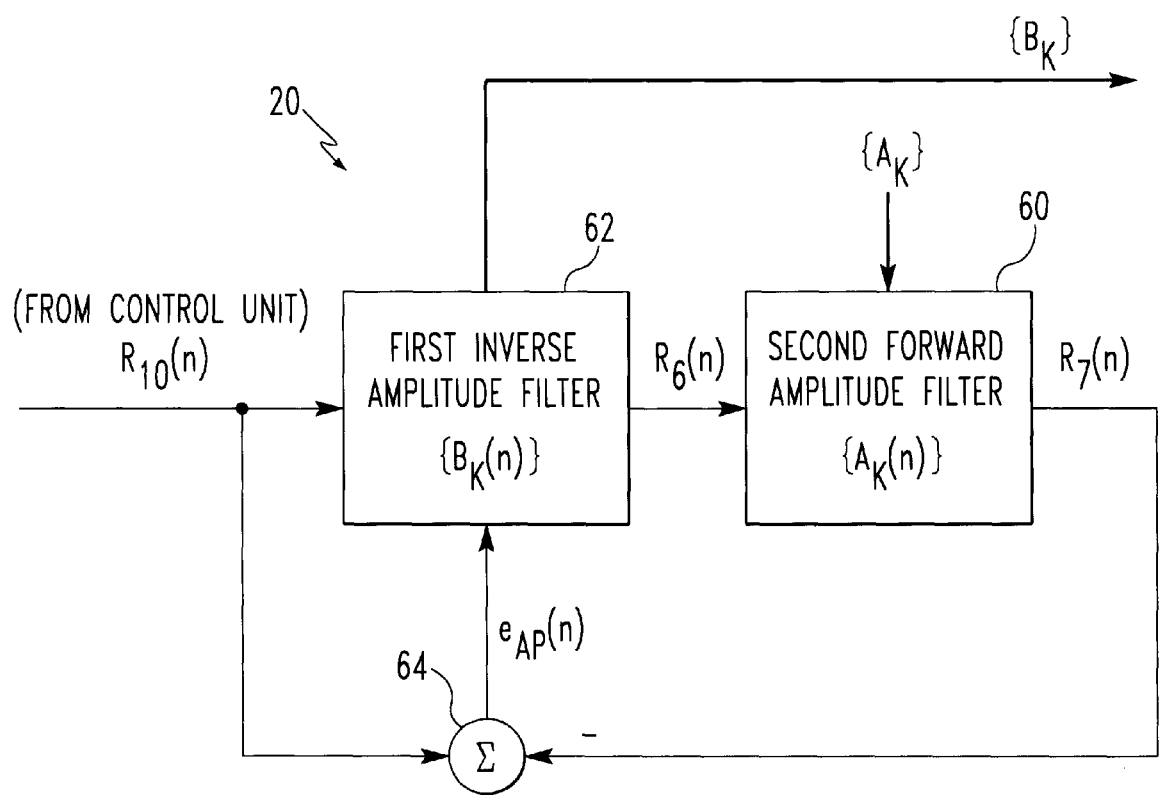
FIG. 5 is a block diagram of the adaptive parametric inverse HPA filtering block of FIG. 2.

With reference to FIG. 5 and with continuing reference to FIGS. 2 and 4, the converged amplitude parameters $A_k(n)$ are provided to a second forward amplitude filter 60 which also implements the polynomial filter of EQ1. The control unit 32 provides to a first inverse amplitude filter 62 random amplitude data $\{R_{10}(n)\}$. The first inverse amplitude filter 62 implements the polynomial filter:

$$R_6(n) = \sum_{i=0}^{N_{AP}} B_i(n) R_{10}^i \quad \text{(EQ6)}$$

For each value $R_{10}(n)$ of random amplitude data $\{R_{10}(n)\}$ received, the first inverse amplitude filter 62 generates a filtered random amplitude data value $R_6(n)$. The second forward amplitude filter 60 implements the polynomial filter:

$$R_7(n) = \sum_{i=0}^{N_{AM}} A_i(n) R_6^i(n) \quad \text{(EQ7)}$$

where the values of $A_i(n)$ are the converged amplitude parameters $A_k(n)$ provided by the first forward amplitude filter 50. For each filtered random amplitude data value $R_6(n)$ received, the second forward amplitude filter 60 generates a forward amplitude value $R_7(n)$. Each random amplitude data $R_{10}(n)$ and corresponding forward amplitude value $R_7(n)$ are subtractively combined in a summing circuit 64 to produce an amplitude error value $e_{AP}(n)$ which is provided in a feedback mode to the first inverse amplitude filter 62. A least means squares curve fitting algorithm, preferably implemented in the first inverse amplitude filter 62, is utilized to update the amplitude parameters $B_i(n)$ in EQ6 above to minimize the amplitude error value $e_{AP}(n)$. Specifically, the amplitude parameters of $B_i(n)$ in EQ6 are updated according to the following equation:

$$B_k(n+1) = B_k(n) + \alpha_k(n) R_6^i(n) G[R_6(n)] e_{AP}(n), k=0, 1, \ldots, N_{AP} \quad \text{(EQ8)}$$

where $\alpha_k(n)$ is a time-varying step size chosen to guarantee fast and stable initial convergence of the amplitude parameters $B_i(n)$ in EQ6 and small final amplitude error value $e_{AP}(n)$ and NAP is the order of the first inverse amplitude filter 62 which is chosen based upon apriori measurement of the AM/AM distortion.

In EQ8, the expression $G[R_6(n)]$ is the gradient of the AM/AM distortion with respect to the input amplitude. The gradient is preferably determined by the following equation:

$$G[R_6(n)] = \sum_{i=0}^{N_{AM}} iA_i(n)R_6^{(i-1)}(n) \quad \text{(EQ9)}$$

The inverse amplitude filter 62 with parameters $B_i(n)$ converged to a steady state form an optimized inverse amplitude filter $\{B_k(n)\}$ which emulates the inverse amplitude response of the HPA 14.

Figure 6:
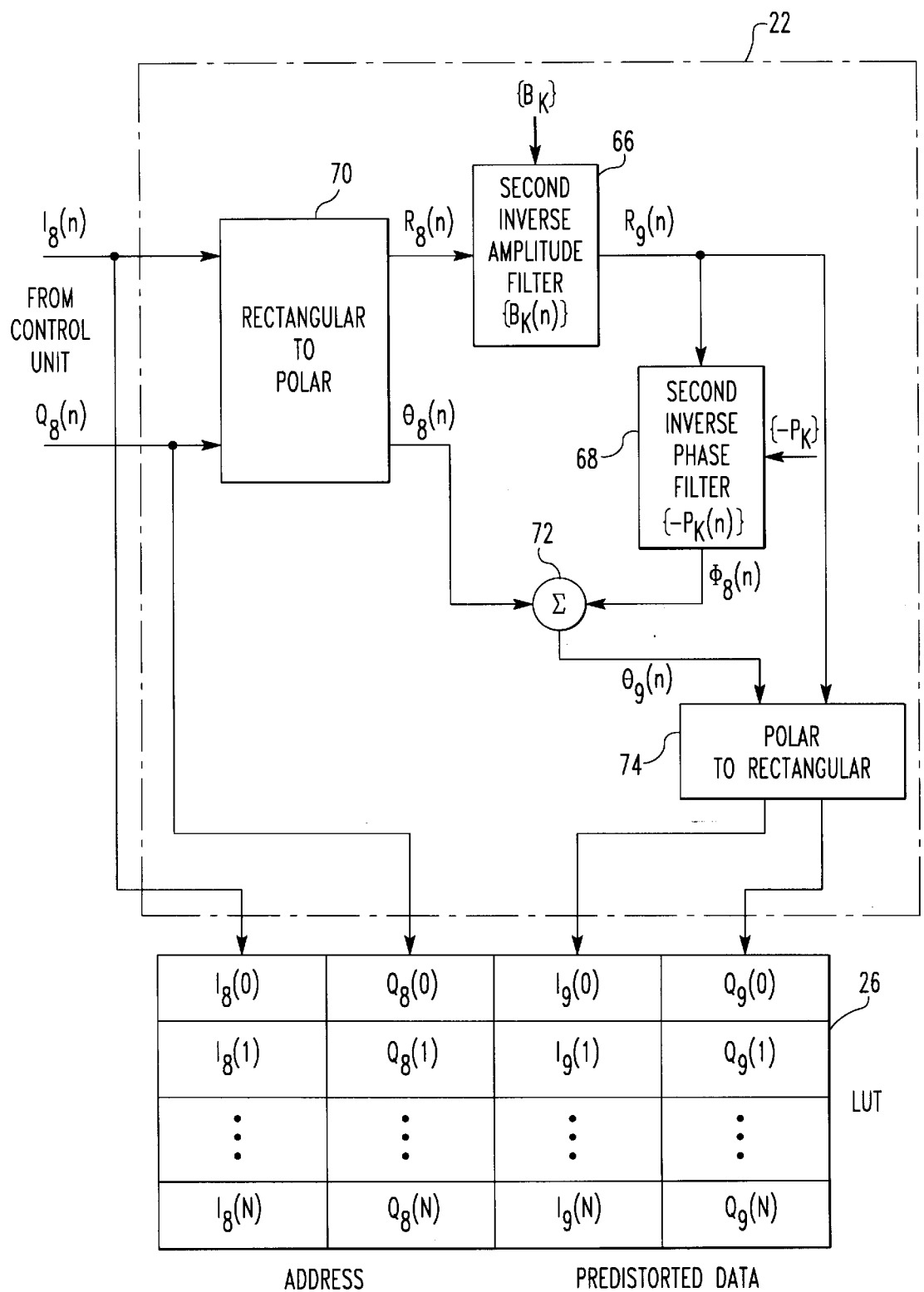
FIG. 6 is a block diagram of the off-line to on-line converter of FIG. 2.

With reference to FIG. 6 and with ongoing reference to FIGS. 2, 4 and 5, the converged parameters $B_k(n)$ are provided to a second inverse amplitude filter 66 which implements the same filter expression as the first inverse amplitude filter 62. Hence, the second inverse amplitude filter with converged parameters $B_k(n)$ implements the optimized inverse amplitude filter $\{B_k(n)\}$. Similarly, the converged negative phase parameters $-P_k(n)$ are provided to a second inverse phase filter 68 which implements the same filter function as the first inverse phase filter 54. Hence, the second inverse phase filter 68 with converged phase parameters $-P_k(n)$ implements the optimized inverse phase filter $\{-P_k(n)\}$.

The control unit 32 provides rectangular-to-polar converter 70 with the exemplary complex data $(I_8(n), Q_8(n))$. The exemplary complex data $(I_8(n), Q_8(n))$ is selected from a possible range of filtered complex signals $(I_1(n), Q_1(n))$ input into the on-line adaptive predistorter 10. The rectangular-to-polar converter 70 converts the exemplary complex data $(I_8(n), Q_8(n))$ to an exemplary amplitude and phase data $(R_8(n), \theta_8(n))$. The exemplary amplitude data $R_8(n)$ is provided to the second inverse amplitude filter 66 which implements the optimized inverse amplitude filter $\{B_k(n)\}$ as the polynomial filter:

$$R_9(n) = \sum_{i=0}^{N_{AP}} B_i(n)R_6^i(n) \quad \text{(EQ10)}$$

to convert the exemplary amplitude data $R_8(n)$ into corrected amplitude data $R_9(n)$. The corrected amplitude data $R_9(n)$ is provided to the second inverse phase filter 68 which implements the optimized inverse phase filter $\{-P_k(n)\}$ as the polynomial filter:

$$\phi_8(n) = -\sum_{i=0}^{N_{PM}} P_i(n)R_9^i(n) \quad \text{(EQ11)}$$

to compute an inverse phase data $\phi_8(n)$. The exemplary phase data $\theta_8(n)$ and the inverse phase data $\phi_8(n)$ are additively combined in summing circuit 72 to produce corrected phase data $\theta_9(n)$. A polar-to-rectangular converter 74 converts the corrected amplitude data $R_9(n)$ and the corrected phase data $\theta_9(n)$ into the predistorted complex data $(I_9(n), Q_9(n))$.

The off-line to on-line converter 22 generates predistorted complex data $(I_9(n), Q_9(n))$ for each input of exemplary complex data $I_8(n), Q_8(n)$ from control unit 32. Each predistorted complex data $(I_9(n), Q_9(n))$ output by the polar-to-rectangular converter 74 is stored in a memory location in one of the lookup tables 26, 28.

The exemplary complex data $(I_8(n), Q_8(n))$ provided to the off-line to on-line converter 22 are also utilized as addresses to a memory location in the selected lookup table 26 or 28 utilized to store the corresponding predistorted complex data $(I_9(n), Q_9(n))$.

Once all the predistorted complex data $(I_9(n), Q_9(n))$ have been generated for one of the look up tables 26, 28, the off-line to on-line converter 22 signals the control unit 32 via a control line. In response to the signal on the control line, the control unit 32 selects the newly updated LUT, e.g., $LUT_1$ 26, to be active and takes the older LUT, e.g., $LUT_2$ 28, out of service.

Based upon the foregoing, it can be seen that the parametric forward HPA filtering block 18 creates the optimized forward amplitude filter $\{A_k\}$ which emulates the forward amplitude response of the HPA 14 and the optimized inverse phase filter $\{-P_k\}$ which emulates the inverse phase response of the HPA 14. The adaptive parametric inverse HPA filtering block 20 utilizes the output of optimized forward amplitude filter $\{A_k\}$ to determine the optimized inverse amplitude filter $\{B_k\}$ of the HPA 14. The optimized inverse phase filter $\{-P_k\}$ and the optimized inverse amplitude filter $\{B_k\}$ are utilized by the off-line to on-line converter 22 to generate the predistorted complex data $(I_9(n), Q_9(n))$.

In response to the input of a filtered complex signal $(I_1(n), Q_1(n))$, predistorted complex data $(I(n)_9, Q_9(n))$ is retrieved from the lookup table 26, 28 selected by the control unit 32 and outputted to multiplexer 30 and modulator 12 as predistorted complex signal $(I_2(n), Q_2(n))$. The predistorted complex signal $(I_2(n), Q_2(n))$ enables the HPA 14 to produce an output to the antenna that corresponds to the filtered complex signal $(I_1(n), Q_1(n))$ input to the on-line adaptive predistorter 10.

The present invention has been described with reference to the preferred embodiments, obvious modifications and alterations will occur to others upon reading and understanding the foregoing detailed description. It is intended that the invention be construed as including all such modifications and alterations, insofar as they come within the scope of the appended claims or the equivalents thereof.

We claim:

1. An amplifier system comprising:

an on-line adaptive predistorter which receives an incoming complex signal and generates a predistorted complex signal related to the incoming complex signal;

a modulator which receives the predistorted complex signal and produces therefrom a modulated analog signal;

an amplifier which receives the modulated analog signal and produces an amplified modulated analog signal;

a demodulator which demodulates at least a sample of the amplified modulated analog signal and produces therefrom a demodulated complex signal;

an adaptive forward filter which combines the predistorted complex signal and the demodulated complex signal to produce an optimized forward amplitude filter that emulates the forward amplitude response of the amplifier and an optimized inverse phase filter that emulates the inverse phase response of the amplifier;

an adaptive inverse filter which filters an output of the optimized forward amplitude filter to produce an optimized inverse amplitude filter that emulates the inverse amplitude response of the amplifier;

an off-line to on-line converter which combines the response of optimized inverse amplitude filter and the response of optimized inverse phase filter to produce predistorted complex data that is utilized for generating the predistorted complex signal.

2. The amplifier system as set forth in claim 1, wherein the adaptive inverse filter combines (i) random amplitude data and (ii) the optimized forward amplitude filter to produce the output which is utilized to produce the optimized inverse amplitude filter.

3. The amplifier system as set forth in claim 2, wherein:
for each input of random amplitude data the adaptive inverse filter produces a forward amplitude error value which is combined with the random amplitude data to produce an amplitude error value; and
the random amplitude data is selected to cause the adaptive inverse filter to adapt to minimize to a desired extent the amplitude error value.

4. The amplifier system as set forth in claim 3, wherein the adaptive inverse filter includes:
an inverse amplitude filter which filters the random amplitude data to produce filtered random amplitude data; and
a summing circuit which sums the random amplitude data and the forward amplitude error value to produce the amplitude error value, wherein:
the optimized forward amplitude filter is utilized to filter the filtered random amplitude data to produce the forward amplitude error value; and
a curve fitting algorithm is utilized to update the parameters of the inverse amplitude filter to minimize to a desired extent the amplitude error value.

5. The amplifier system as set forth in claim 4, wherein the optimized inverse amplitude filter includes the inverse amplitude filter with updated parameters.

6. The amplifier system as set forth in claim 1, wherein:
the off-line to on-line converter utilizes exemplary complex data to stimulate the response of the optimized inverse amplitude filter and the response of the optimized inverse phase filter to produce the predistorted complex data.

7. The amplifier system as set forth in claim 1, wherein the adaptive forward filter includes:
a rectangular-to-polar converter which converts the predistorted complex signal into a predistorted polar signal and which converts the demodulated complex signal into a demodulated polar signal;
a forward amplitude filter which filters the amplitude portion of the predistorted polar signal and produces a filtered amplitude portion of the predistorted polar signal; and
a summing circuit which combines the filtered amplitude portion of the predistorted polar signal and the amplitude portion of the demodulated polar signal to produce a polar amplitude difference value, wherein:
a curve fitting algorithm is utilized to update the parameters of the forward amplitude filter to minimize to a desired extent the polar amplitude difference value.

8. The amplifier system of claim 7, wherein the optimized forward amplitude filter includes the forward amplitude filter with updated parameters.

9. The amplifier system as set forth in claim 1, wherein the adaptive forward filter includes:
a rectangular-to-polar converter which converts the predistorted complex signal into a predistorted polar signal and which converts the demodulated complex signal into a demodulated polar signal;
an inverse phase filter which filters the amplitude portion of the predistorted polar signal into a filtered phase value;
a first summing circuit which combines the phase portion of the predistorted polar signal and the phase portion of the demodulated polar signal to produce a polar phase difference value; and
a second summing circuit which combines the polar phase difference value and the filtered phase value to obtain a phase error value, wherein:
a curve fitting algorithm is utilized to update the parameters of the inverse phase filter to minimize to a desired extent the phase error value.

10. The amplifier system as set forth in claim 9, wherein the optimized inverse phase filter includes the negative of the inverse phase filter with adapted parameters.

11. The amplifier system as set forth in claim 6, wherein the off-line to on-line converter includes:
a rectangular-to-polar converter which converts the exemplary complex data to exemplary polar data, the amplitude portion of the exemplary polar data is filtered by the optimized inverse amplitude filter to produce an amplitude portion of polar predistorted data the amplitude portion of the polar predistorted data, is filtered by the optimized inverse phase filter to produce inverse phase data;
a summing circuit which combines the phase portion of the exemplary polar data and the inverse phase data to produce a phase portion of polar predistorted data; and
a polar to rectangular converter which converts the amplitude portion of polar predistorted data and the phase portion of polar predistorted data into the predistorted complex data.

12. The amplifier system as set forth in claim 1, wherein the on-line adaptive predistorter includes a lookup table which stores the predistorted complex data and generates therefrom, in response to receiving the incoming complex signal, the predistorted complex signal.

13. A method of determining predistorting data utilized to compensate for nonlinear amplitude and phase distortions of an amplifier, the method comprising the steps of:
(a) converting incoming complex signals to corresponding predistorted complex signals;
(b) modulating the predistorted complex signals to produce modulated analog signals;
(c) amplifying the modulated analog signals to produce amplified analog signals;
(d) demodulating the amplified analog signals to produce demodulated complex signals;
(e) sampling each predistorted complex signal and a temporally corresponding demodulated complex signal; and
(f) combining each predistorted complex signal and each demodulated complex signal to produce predistorting data utilized to generate the predistorted complex signals, wherein step (f) includes the steps of:
converting each predistorted complex signal to predistorted polar data;
converting each demodulated complex signal to demodulated polar data;
generating from the amplitude portion of each predistorted polar data and the temporally corresponding amplitude portion of each demodulated polar data an optimized forward amplitude filter;
generating from the phase portion of each predistorted polar data and the temporally corresponding phase portion of each demodulated polar data an optimized inverse phase filter;

generating from a combination of random amplitude data and the optimized forward amplitude filter an optimized inverse amplitude filter; and generating the predistorting data from a combination of exemplary data signals, the optimized inverse amplitude filter and the optimized inverse phase filter.

14. The method as set forth in claim 13, further including the steps of:

converting each predistorted complex signal into predistorted polar data and the temporally corresponding demodulated complex signal into demodulated polar data;

sorting the amplitude portions of the predistorted polar signals into one of ascending and descending order;

ordering (i) the amplitude portions of demodulated polar data and (ii) the phase portions of the demodulated polar data based on the sorted indexed of the sorted amplitude portions of the predistorted polar signals; filtering each of the ordered data in (i) and (ii) to remove measurement noise; and reordering the data and the signals into original order.

15. A method of updating predistorting data utilized to compensate for nonlinear amplitude and phase distortions of an amplifier, the method comprising the steps of:

(a) supplying incoming complex signals to an active look-up table which stores current predistorted complex data and an inactive look-up table configured to store updated predistorted complex data, with each predistorted complex data corresponding to a predistorted complex signal;

(b) supplying from the active look-up table predistorted complex signals that correspond to the incoming complex signals;

(c) modulating the predistorted complex signals that correspond to the incoming complex signals to produce modulated analog signals;

(d) amplifying the modulated analog signals to produce amplified analog signals;

(e) demodulating the amplified analog signals to produce demodulated complex signals;

(f) sampling each predistorted complex signal and its temporally corresponding demodulated complex signal;

(g) combining each predistorted complex signal and its temporally corresponding demodulated complex signal to produce updated predistorted complex data;

(h) storing each updated predistorted complex data in the inactive look-up table;

(i) deactivating the active look-up table so that it becomes the inactive look-up table; and (j) activating the inactive look-up table so that it becomes the active look-up table.

16. The method as set forth in claim 15, wherein step (f) includes the steps of:

sampling each predistorted complex signal;

delaying by an interval corresponding to signal propagation delay in steps (c)–(e); and sampling each temporally corresponding demodulated complex signal.

17. An apparatus for determining predistorting data utilized to compensate for nonlinear amplitude and phase distortions of an amplifier, the apparatus comprising:

a pair of look-up tables connected to receive incoming complex signals and configured to store predistorted complex data, with each predistorted complex data corresponding to a predistorted complex signal;

a controller which causes one of the pair of look-up tables to be active and the other of the pair of look-up tables to be inactive, with the active look-up table supplying predistorted complex signals that correspond to the incoming complex signals;

a modulator which modulates the predistorted complex signals from the active look-up table to produce modulated analog signals;

an amplifier which amplifies the modulated analog signals to produce amplified analog signals;

a demodulator which demodulates the amplified analog signals to produce demodulated complex signals;

a sampler which samples each predistorted complex signal and its temporally corresponding demodulated complex signal; and a combiner which combines each predistorted complex signal and its temporally corresponding demodulated complex signal to produce updated predistorted complex data, wherein:

the controller causes the updated predistorted complex data to replace the predistorted complex data in the inactive look-up table; and the controller causes the active look-up table to become inactive and the inactive look-up table to become active.

* * * * *